United States Patent [19]
Lin et al.

[11] Patent Number: 5,700,731
[45] Date of Patent: Dec. 23, 1997

[54] METHOD FOR MANUFACTURING CROWN-SHAPED STORAGE CAPACITORS ON DYNAMIC RANDOM ACCESS MEMORY CELLS

[75] Inventors: John C. H. Lin, Hsin-chu; Daniel Hao-Tien Lee; Meng-Jaw Cherng, both of Hsinchu, all of Taiwan

[73] Assignee: Vanguard International Semiconductor Corporation, Hsin-Chu, Taiwan

[21] Appl. No.: 568,722

[22] Filed: Dec. 7, 1995

[51] Int. Cl.[6] ................................................. H01L 21/20
[52] U.S. Cl. ............................ 438/381; 438/397; 438/254
[58] Field of Search ...................................... 437/47, 52, 60, 437/919; 148/DIG. 14; 438/381, 397, 254

[56] References Cited

U.S. PATENT DOCUMENTS

| | | | |
|---|---|---|---|
| 5,158,905 | 10/1992 | Ahn | 437/919 |
| 5,336,630 | 8/1994 | Yun et al. | 437/47 |
| 5,464,787 | 11/1995 | Ryou | 437/47 |
| 5,583,069 | 12/1996 | Ahn et al. | 437/60 |

OTHER PUBLICATIONS

K. Nakagawa et al In IEDM Technical Digest pp. 817–818, 1990, "Fabrication of 64M DRAM With i-Line Phase Shift Lithography".

M.D. Levenson et al, IEEE Transactions on Electronic Devices, vol. ED-29, No. 12 pp. 1828–1836, Dec. 1982, "Improving Resolution in Photolithography With a Phase–Shifting Mask".

"0.2 μm Or Less i-Line Lithography By Phase–Shifting–Mask Technology" By H. Jinbo et al, IEDM Technical Digest pp. 825, 828, 1990.

"Extending Optical Lithography to the Gigabit Era", Solid State Technology vol. 38, No. 2 pp. 57–66, Feb. 1995.

T. Kaga et al, IEEE Transactions On Electron Devices, vol. 38, No. 2 pp. 255–260, "Crown–Shaped Stacked Capacitor Cell For 1.5.V Operation 64 Mb DRAMs".

H. Arima et al, IEDM Technical Digest, pp. 651–654, "A Novel Stacked Capacitor Cell With Dual Cell Plate For 64Mb DRAMs".

S. Inoue et al, IEDM Technical Digest, pp. 31–34, 1989, "A Spread Stacked Capacitor (SSC) Cell For 64MBIT DRAMs".

T. Ema et al, IEDM Technical Digest, pp. 592–595, 1988, "3–Dimensional Stacked Capacitor Cell For 16M and 64M DRAMs".

*Primary Examiner*—Tuan H. Nguyen
*Attorney, Agent, or Firm*—George O. Saile; Stephen B. Ackerman

[57] ABSTRACT

A method for manufacturing an array of dynamic random access memory (DRAM) cells having a single crown-shaped or a double crown-shaped stacked capacitors is accomplished. The method involves forming an array of device areas on a silicon substrate in which FETs for the DRAM cells are formed. After forming bit line contacts and bit line metallurgy contacting one of the two source/drain areas of each FET, a thick low melting temperature glass (BPSG) is deposited and planarized by annealing. Node capacitor contact openings are formed in the BPSG using a polysilicon sidewall method that reduces the contact size, and a thick polysilicon layer is deposited to contact the node source/drain areas of the FETs, and also provides a planar polysilicon surface. A specially designed edge phase-shift mask is then used with a positive photoresist to pattern the thick polysilicon layer and form crown-shaped bottom electrodes. The capacitors are then completed by depositing a interelectrode dielectric and forming a polysilicon top electrode. A second phase-shift mask design is used to form a double crown-shaped capacitor. These new capacitors are estimated to increase the capacitance over the more conventional thick capacitor by about 50 and 115%, respectively.

18 Claims, 7 Drawing Sheets

METHOD FOR MANUFACTURING CROWN-SHAPED STORAGE CAPACITORS ON DYNAMIC RANDOM ACCESS MEMORY CELLS

BACKGROUND OF THE INVENTION (1) Field of the Invention

The present invention relates to semiconductor integrated circuit devices, and more particularly to the fabrication of an array of dynamic random access memory (DRAM) cells having crown-shaped stacked capacitors with increased capacitance.

(2) Description of the Prior Art

Dynamic random access memory (DRAM) circuits are used extensively in the electronic industry for storing and retrieving digital information, and are particularly useful in the computer industry for data storage. The DRAM circuit is composed of a large array of memory cells and peripheral circuits that are concurrently fabricated on a semiconductor substrate. The peripheral circuits are used to randomly access and to retrieve or store the digital information on the memory cell. The individual memory cells are composed of a single pass transistor, usually a field effect transistor (FET) and a storage capacitor. The digital information is stored as charge on the capacitor. The cell is accessed by applying a voltage on the gate electrode of the FET via interconnecting word lines, and the data (charge) is stored or sensed via bit lines. The storage capacitors are formed either in deep trenches etched in the cell area on the substrate or alternatively, are formed over and within the cell area from patterned conducting and insulating layers after the pass transistors are formed.

Advances in the semiconductor processing technologies have dramatically reduced the size of these individual memory cells and increased the cell density on the DRAM chip. For example, the number of memory cells on the chip have, in the past tripled every three years and is currently at 64 Mbits. This trend is expected to continue well into the next century. For example, the number of memory cells on a DRAM chip are projected to reach 256 Megabits by the year 1998 and about 1 Gigabits by the year 2001. If this trend is to continue while maintaining a DRAM chip of reasonable size, then the memory cells on the chip must be substantially reduced in size. For example, one method of reducing the cell size is described by K. Nakagawa et al in IEDM Technical Digest pages 817–818, 1990, entitled "Fabrication of 64M DRAM With i-Line Phase shift Lithography", in which current i-line lithography, (ultraviolet (uv) radiation at 365 nanometer wavelength) and phase-shift techniques are used to extend the 0.4 micrometer (um) resolution of the current i-line lithography to 0.3 um. This method is used by Nakagawa for fabricating narrower word lines and bit lines on a 64 Mbit DRAM chip, and thereby reducing the cell size. A method of improving the current lithographic resolution using phase-shift masks has been initially reported by M. D. Levenson et al, in the IEEE Transactions on Electronic Devices, Vol. ED-29, No. 12, pages 1828–1836, Dec. 1982. Another article entitled "0.2 um or Less i-Line Lithography By Phase-Shifting-Mask Technology" is reported by H. Jinbo et al on extending the i-line lithography to less than 0.2 um and this article can be found in the IEDM Technical Digest pages 825–828, 1990. A more recent article by M. D. Levenson on advance in optical lithography and more specifically on the use of phase-shift masks entitled "Extending Optical Lithography to the Gigabit Era" can be found in Solid State Technology Vol. 38, No. 2, pages 57–66, Febuary 1995.

Unfortunately, as these individual DRAM memory cells are reduced in size, the lateral area of the storage capacitors must also be decreased so as to remain within the cell area. However, this reduction in the storage capacitor size makes it difficult to store sufficient charge on the capacitor to maintain the required signal-to-noise level, and to maintain a reasonable refresh cycle time to retain the necessary charge level. Therefore, alternative methods are required to maintain the capacitance while restricting the capacitor area over the smaller cell area. Of the two basic methods of making storage capacitors, trench and stacked capacitors, the stacked capacitor has received considerable interest in recent years because of the variety of ways that its shape can be changed in the third dimension (vertical direction) to increase the capacitance without increasing the area it occupies on the cell. Another advantage of using stacked capacitor is its immunity to soft errors which are typically caused by unavoidable high energy radiation.

A number of DRAM devices having these types of stacked capacitor structures have been reported in the literature, but generally required additional processing steps. For example, T. Kaga, et al, IEEE Transactions on Electron Devices, Vol. 38, No. 2, Pages 255–260, teach a method for forming a crown-shaped stacked capacitor by depositing a series of polysilicon and silicon oxide in a recess and then etching back to form the vertical sidewall for the crown-shaped stacked capacitor. Another method for forming a stacked capacitor having a dual cell plate is described by H. Arima et al in the IEDM Technical Digest. Pages 651–654., Other types of stacked capacitors have been reported, include capacitors having over lapping electrode, for example, by S. Inoue et al, in the IEDM Technical Digest, Pages 31–34, 1989, and capacitors having fin-shaped electrodes, as reported by T. Ema et al also published in the IEDM Technical Digest, pages 592–595, 1988.

In general, the stacked capacitors require more processing step and are more costly to manufacture, and would therefore, be expected to have lower process and final test yields. Therefore, there is still a need to further improve the capacitor structures and to simplify the manufacturing process.

SUMMARY OF THE INVENTION

It is a principle object of a first embodiment of this invention to provide a method for fabricating a DRAM device having an array of crown-shaped stacked capacitors each capacitor having a single crown shaped electrode, and increased capacitance.

It is an other object of the second embodiment of this invention to provide a method for fabricating a DRAM device having an array of crown-shaped stacked capacitors, each capacitor having a double crown shaped electrode with increased capacitance.

It is another object to fabricate these improved capacitors using a phase-shift mask and i-line and deep UV lithography.

It is still another object of this invention to provide a capacitor that is simple to manufacture and cost effective.

The method of this invention for forming an array of DRAM cells having the crown-shaped storage capacitors starts by providing a semiconductor substrate. Typically, the substrate is composed of a lightly P- doped single crystal silicon. An array of device areas are provided on the substrate by forming Field OXide (FOX) areas that surround and electrically isolate the device areas. For example, the conventional LOCal Oxidation of Silicon (LOCOS) technique can be used to form the FOX by selective oxidation of the substrate. A FET thin gate oxide in then formed on the device areas by thermal oxidation, and the FET gate electrodes are formed next by depositing and patterning a first polysilicon layer, usually doped $N^+$ and having a silicide layer and a cap oxide ($SiO_2$) on its surface. Concurrently, and from the same first polysilicon layer, word lines are formed elsewhere on the substrate to provide electrical connection to peripheral circuits on the DRAM chip. Two lightly doped source/drain areas, usually by ion implantation, are formed adjacent to, and on each side of the FET gate electrodes. Insulating sidewall spacers are formed on the gate electrode by depositing an insulating layer, such as silicon oxide and anisotropically etch back the insulator to the substrate surface. Ohmic contacts to the source/drain areas are formed adjacent to the sidewalls, typically by a second implantation to complete the field effect transistors (FET). Alternatively, the ohmic contacts can be made at a later process step by out diffusing an $N^-$ type dopant from an $N^+$ doped polysilicon layer that forms part of the interconnecting metallurgy. After completing the array of FETs, a first insulating layer is deposited to electrically insulate the exposed source/drain contact areas, and contact openings are then etched in the first insulating layer to one of the two source/drain areas of each FET (first source/drain area). A second polysilicon layer is deposited also $N^+$ doped and patterned, for example, by photoresist masking and anisotropic etching, to form the bit line interconnections to the FETs. A second insulating layer is deposited over the bit lines as an electrical insulation. A relatively thick third insulating layer having a low flow temperature, preferably a borophosphosilicate (BPSG) is deposited and annealed to form a layer having an essentially planar surface. The node contact openings are now formed in the first, second and third insulating to the second source/drain contact of each memory cell FET. One preferred method involves using a polysilicon sidewall spacer technique that reduces the node contact width and extends the resolution limit of the current lithography, The method involves depositing a third polysilicon layer on the third insulating layer, and then using photoresist masking and anisotropic etching, the node contact openings are etched in the third polysilicon layer and partially into the third insulating layer. After removing the photoresist mask, a conformal fourth polysilicon layer is deposited over the partially etched node contact openings and anisotropically blanket etched back to the third polysilicon. This then forms sidewall spacers in the node contact openings that reduce further the size of the opening. The third insulating layer exposed in the node contact openings is anisotropically and selectively etched to the source/drain, while the third polysilicon layer and the sidewall spacers serve as the etch mask for the oxide etch.

After completing the node contact openings, the array of crown-shaped stacked capacitors are formed by the method of this invention. To achieve this, a conformal fifth polysilicon layer, also referred to as the "bottom electrode polysilicon layer", and doped $N^+$ with an N-type dopant, is deposited on the planar surface of the fourth polysilicon and in the node contact openings. This fifth polysilicon layer is relatively thick, and its thickness determines the eventual height of the crown portion on the stacked capacitors. A positive photoresist is applied to the substrate, for example, by spin coating, and the photoresist coating is then exposed through a phase-shifting mask (PSM) or reticule in the case of a step and repeat projection system. More specifically, the mask or reticle is designed, by the method of this invention, to have an array of 180 degrees phase shift regions (material) that align over the planned cell areas, the edge of the patterned phase shift material on the mask being aligned over the region where the crown-shaped portion of the bottom electrodes are to be formed. The photoresist is then exposed through this phase edge mask using ultra violet (uv) radiation, for example, using an i-line stepper having an exposure wavelength of 365 nanometers (nm). Alternatively, deep UV radiation having a wavelength of 248 nm can also be used to increase further the resolution. As is commonly known in physical optics, the difference in the optical path length between the diffracted uv light at the edge of phase shift regions destructive interference resulting in a low light intensity image that is insufficient to expose the positive photoresist. This result, after developing the photoresist, in a narrow photoresist pattern, that exceeds the resolution limit of the current lithography using a conventional mask, and is formed over the region where the crown-shaped portion of the bottom electrode is to be formed. The photoresist image is then replicated in the fifth polysilicon layer using anisotropic plasma etching to form the array of bottom electrodes having a vertical single crown-shaped portion. The array of stacked capacitors are then completed, after stripping the photoresist, by forming an interelectrode dielectric layer and depositing a sixth $N^+$ doped polysilicon layer that is patterned to form the top electrode.

A second embodiment of the invention involves the design of a phase shift edge mask having an array of 180 degrees phase shift regions that include two arrays of 180 degrees phase shift stripes regions that are orthognal to each other, and provide a second phase edge for forming a double crown-shaped stacked capacitor.

BRIEF DESCRIPTION OF THE DRAWINGS

The preferred embodiments are best understood with reference to the accompanying drawings that include the following Figs.

FIG. 13-A and 13-B shows an enlarged schematic aerial view of an isolated bottom electrode for a double crown-shaped capacitor, and a schematic cross sectional view of the bottom electrode of the double crown-shaped capacitor, respectively.

DESCRIPTION OF THE PREFERRED EMBODIMENTS

Now in keeping with the objects of this invention, the first embodiment for manufacturing an array of DRAM cells having crown-shaped stacked capacitor is covered in detail. The crown-shaped capacitors can be fabricated on FET structures that are currently used in the manufacture of DRAMs, and the method of fabricating the FETs are only briefly described to better understand the current invention. To further simplify the description only a portion of the array of DRAM cells is shown for two adjacent cells.

Figure 1:
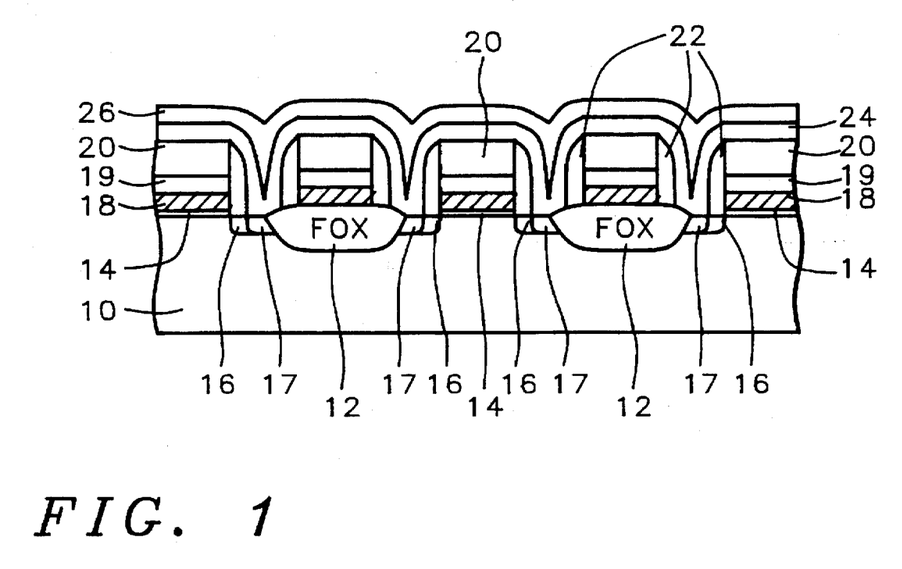
FIGS. 1 through 6 depict in schematic cross-sectional view the sequence of process steps for two single crown-shaped capacitors formed on two adjacent DRAM cells.

Referring now to FIG. 1, a cross-sectional view of the partially completed DRAM cell is shown having a field effect transistor (FET) built on the surface of a semiconductor substrate 10. The preferred substrate is composed of P-type single crystal silicon with a <100> crystallographic orientation. A thick Field OXide 12 (FOX), for electrically isolating the device areas, is first formed surrounding the device areas where the FETs are fabricated. Briefly, the method for forming the FOX commonly practiced in the industry is to use a thin thermal oxide (pad oxide) and a silicon nitride layer as an oxidation resistant mask (not shown in the Figs.). The desired field oxide regions are etched open in the silicon oxide/silicon nitride layer using conventional photolithographic techniques and etching, and the field oxide 12 is then thermally grown in an oxidizing ambient, typically to a thickness of about 4000 to 6000 Angstroms.

The semiconductor devices are fabricated next on and in the device areas of the substrate 10 after removing the silicon nitride layer using a wet etch, such as a heated phosphoric acid ($H_3PO_4$). For a typical DRAM cell, the most commonly used transistor is an N-channel field effect transistor (FET) having gate electrodes that are formed from a doped polysilicon layer usually with a silicide layer, such as tungsten silicide (WSi2) on the surface to improve the electrical conductivity.

As shown in FIG. 1, the FETs are formed by first growing a good quality thermal oxide to form the gate oxide 14 in the device area. The preferred thickness of the gate oxide is between about 80 to 140 Angstroms. A first polysilicon layer 18 is blanket deposited, for example, by low pressure chemical vapor deposition (LPCVD), and a silicide layer 19 is deposited on the polysilicon layer 18. For example, one common method for depositing the $WSi_2$ is by CVD using tungsten hexafluoride ($WF_6$) and silane ($SiH_4$). A cap oxide 20, such as a CVD silicon oxide, is deposited on the silicide layer 19 and all three layer are patterned by conventional photolithographic techniques and an anisotropic plasma etch (dry etch) to form the gate electrode structure comprising of layer 18, 19 and 20, as shown in FIG. 1. The patterned layer 18 and 19 also, concurrently, form the word lines that are used to interconnect the gate electrodes to other circuits on the DRAM chip. Typically, the thickness of layer 18 is between about 2000 to 3000 Angstroms and is doped with an N-type dopant, such as arsenic (As) or phosphorus (P) for the N-channel FETs. The silicide layer is preferably between about 800 to 1500 Angstroms thick. The cap oxide 20 is also usually formed by low pressure CVD, for example, by the decomposition of tetraethoxysilane (TEOS), and the thickness is usually between about 1000 to 2000 Angstroms.

In todays narrow channel FET devices it is common practice to form lightly doped regions 16 for the source/drain to minimize undesirable short channel effects that can occur. This doping is usually accomplished for N-channel FETs by implanting a N-type species, such as arsenic or phosphorous, in the device area adjacent to the gate electrode 18. For example, a typical implantation might consist of a phosphorous $P^{31}$ at a dose of between 1 to 10 E 13 atoms/$cm^2$ and with an energy of 30 to 80 Kev. As is common in the industry photoresist masking can be used to avoid implanting in areas not requiring the implant.

After forming the lightly doped source/drain areas 16, sidewall insulating spacers 22 are formed on the side-walls of the gate electrode structures composed of layer 18 and 19. These spacers are formed by depositing a blanket layer of low temperature silicon oxide on the substrate and using an anisotropic etching to etch back to the surface of the source/drain area, as is also shown in FIG. 1. For example, the silicon oxide can be a chemical vapor deposition using tetraethoxysilane (TEOS) at a temperature in the range of about 650° to 900° C., and the etch back can be accomplished with a reactive plasma etcher of various design and using an appropriate gas mixture. For example, the etching can be performed in a gas mixture of carbon tetrafluoride and hydrogen ($CF_4/H_2$).

The FET device is then completed by forming the source/drain contact areas 17 using, for example, a high dose N-type implant in the source/drain areas adjacent to the spacers 22. For example, arsenic ($As^{75}$) can be used having a dose of between about 2 E 15 to 1 E 16 and an implant energy of between about 20 to 70 KeV. Alternatively, the $N^+$ doped contacts can be formed at a later processing step by out diffusing from an $N^+$ dopant source, such as from an $N^+$ polysilicon layer used as part of the capacitor bottom electrode and $N^+$ polysilicon bit line metallurgy.

Still referring to FIG. 1, a first insulating layer 24 is deposited, providing an electrical insulating layer over the source/drain contact areas 17. Layer 24 is preferably deposited by low pressure CVD (LPCVD) using for example TEOS and is preferably between about 1000 to 2000 Angstroms thick. Typically, the bit line contact openings are etched next in layer 24 to one of the two source/drain areas (first source/drain areas) of each FET in the array of memory cells, and the bit line metallurgy is formed next. However, to simplify the drawing, the bit line contacts and bit line metallurgy are not depicted in the drawing in the Figs. But, briefly, the bit line contact openings are formed by etching in layer 24 to the source/drain areas using conventional photolithographic techniques and anisotropic plasma etching, and the bit line metallurgy is form similar to the method used to form the polysilicon/silicide gate electrodes and word lines by patterning a second polysilicon layer. A second insulating layer 26 is now deposited over the bit line and elsewhere over the first insulating layer 24, as shown in FIG. 1.

Figure 2:
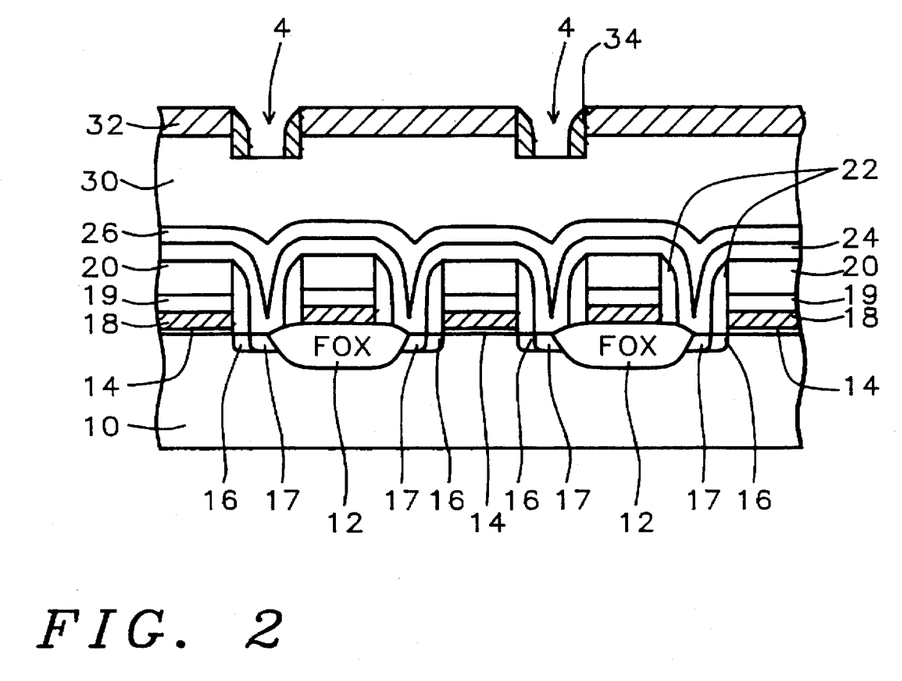
Figure 3:
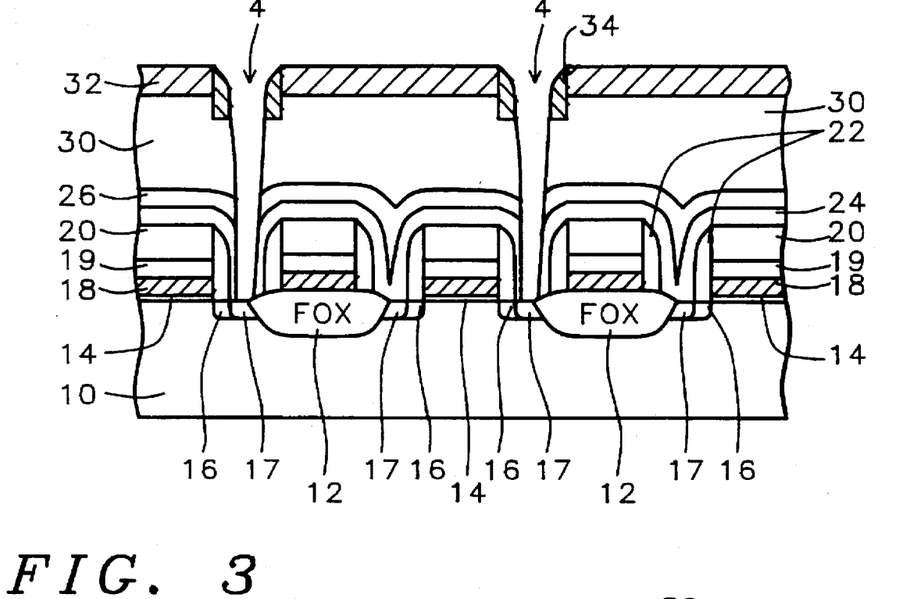

The next sequence of steps, as depicted in FIGS. 2 and 3, describe in detail the method of forming a planar insulating structure over the FETs on which the crown shaped capacitors are formed. After forming the planar insulating layer, narrow capacitor node contact openings are formed to the second source/drain areas of each FET to which are connected the bottom (node) electrodes for the crown-shaped capacitors of this invention.

Referring now to FIG. 2, a planarizing third insulating layer 30, comprising of a low melting temperature glass and therefore having a low flow temperature is deposited on the partially completed DRAM structure shown in FIG. 1. The layer 30 is preferably composed of a borophosphosilicate glass (BPSG), and the preferred thickness of layer 30 is between about 2000 to 3500 Angstroms. The layer 30 is then made planar by thermal annealing in a furnace at a temperature of between about 800° to 900° C. for about 15 to 30 minutes.

Narrow node contact openings having widths that are less than the current lithographic resolution limit (about 0.4 micrometers) are now formed in layer 30 using the following method. A third polysilicon layer 32 is deposited on the planar insulating layer 30, as shown in FIG. 2. Layer 32 is preferably composed of a $N^+$ doped polysilicon layer. One preferred method of depositing layer 32 is in a low pressure chemical vapor deposition (LPCVD) reactor using, for example, a silane ($SiH_4$) gas. The preferred thickness of layer 32 is between about 2500 to 3500 Angstroms and the preferred dopant concentration is between about 1.0 E 20 to 1.0 E 22 atoms/$cm^3$. For example, the dopant species can be either arsenic (As) or phosphorous (P) and the doping can be achieved by either ion implantation or alternatively, by doping the polysilicon layer in situ during the LPCVD by adding phosphine ($PH_3$) to the reactant gas.

Also shown in FIG. 2, node contact openings 4 are etched in the third polysilicon layer 32 and partially into the planar insulating layer 30 over the source/drain area 17 using conventional photolithographic techniques and anisotropic plasma etching so as to achieve vertical walls within the openings 4. Polysilicon layer 32 and the planar insulating layer (BPSG) 30 can be etched in a fluorinated gas, such as carbon tetrafluoride ($CF_4$), at low pressure to achieve vertical walls. The preferred depth of the recess etched in the planar insulating layer 30 is between about 1500 to 2500 Angstroms and preferably to a depth of about 2000 Angstroms below the surface of layer 30. After etching the opening 4 in layer 32 and partially into the insulating layer 30, and stripping the photoresist etch mask, a fourth polysilicon layer 34, also doped $N^+$, is conformally deposited on the third polysilicon layer 32 and in the contact opening 4, and blanket etched back anisotropically to form the sidewall spacers 34 in the contact openings 4, as shown in FIG. 2. and also exposing the surface of the planar insulating layer 30 within the sidewall spacer 34. The preferred thickness of layer 34 is determined by the size of the contact openings that are desired, but is typically between about 600 to 1000 Angstroms for an opening 4 in layers 30 having a width of between about 4000 to 5000 Angstroms.

Referring now to FIG. 3, the BPSG layer 30 is selectively and anisotropically etched to the source/drain contacts 17 in the node contact opening 4. The polysilicon layer 32 and the sidewall polysilicon 34 serve as the etch mask. By way of example, if the node contact openings are at the lithography resolution limit (e.g. about 0.4 um for the i-line lithography) and the sidewall spacer are 0.1 um, then the final contact openings are only about 0.2 um in width.

Figure 4:
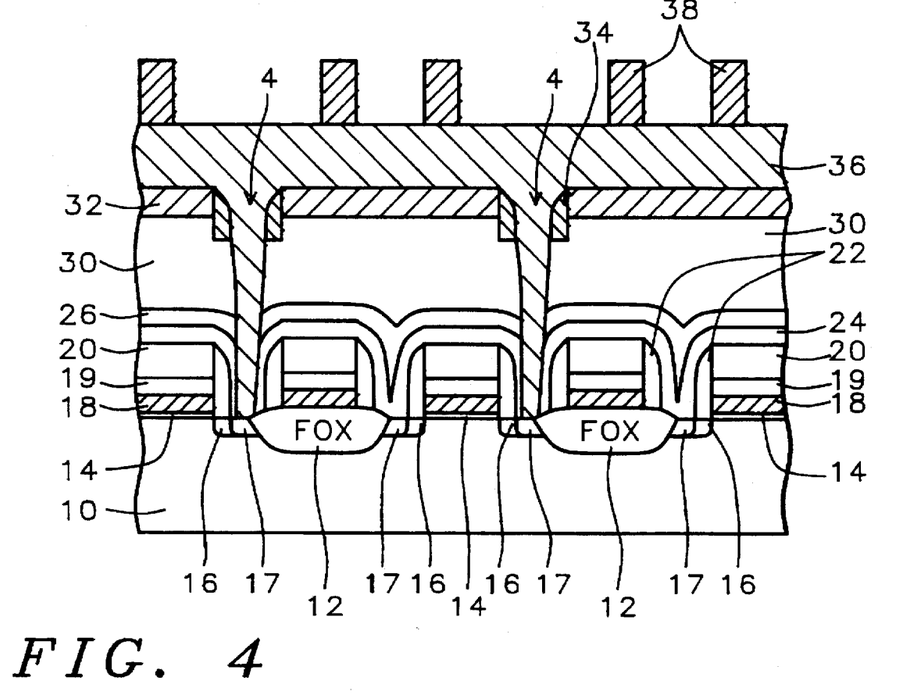
Figure 5:
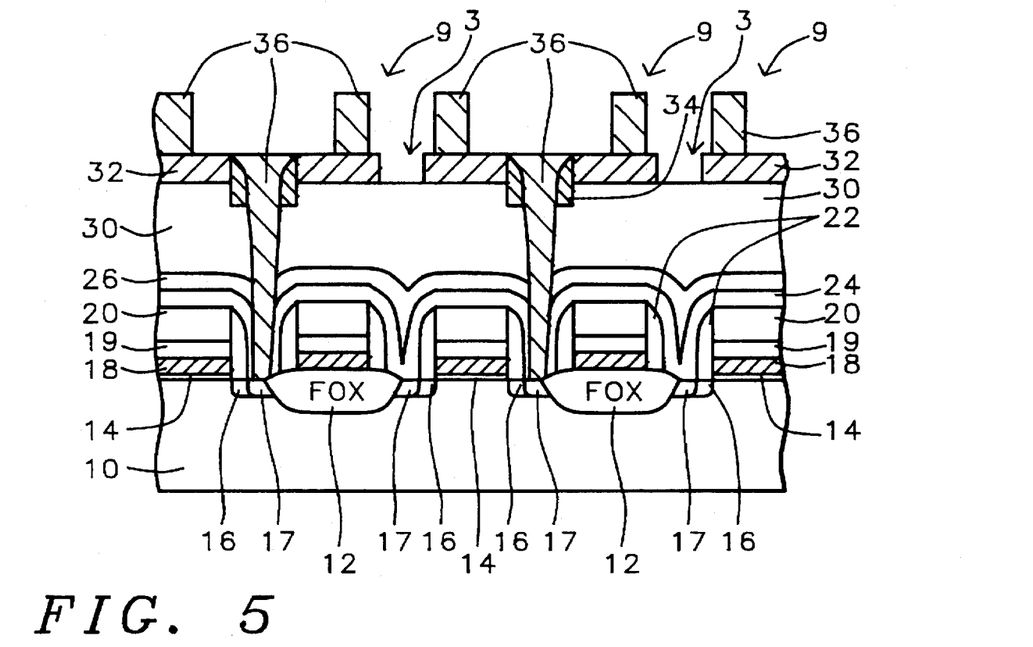
Figure 6:
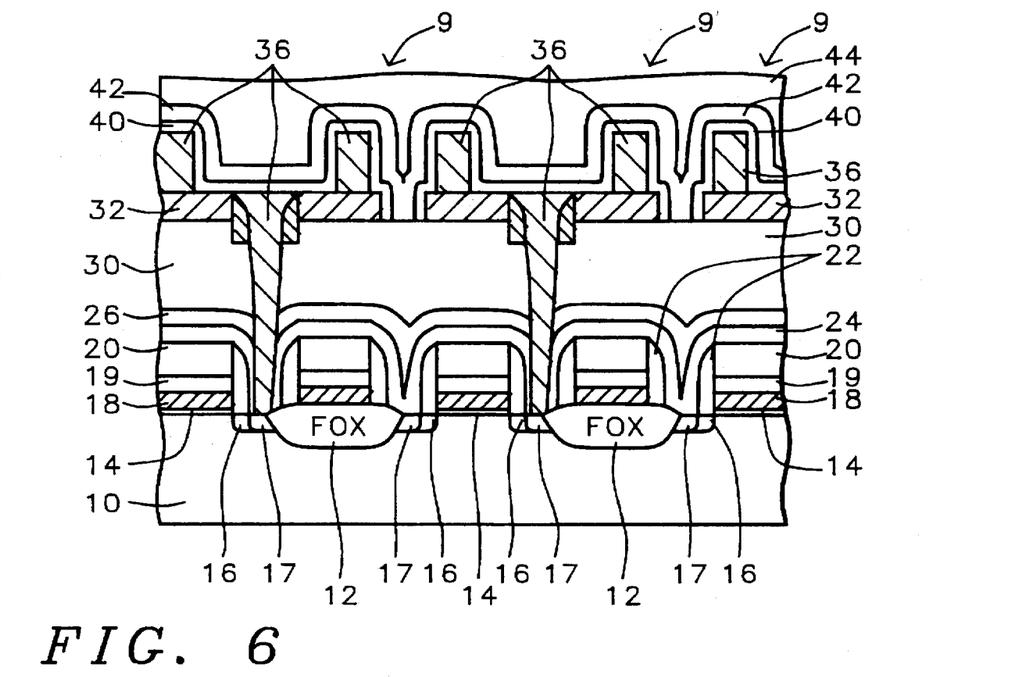
Figure 7:
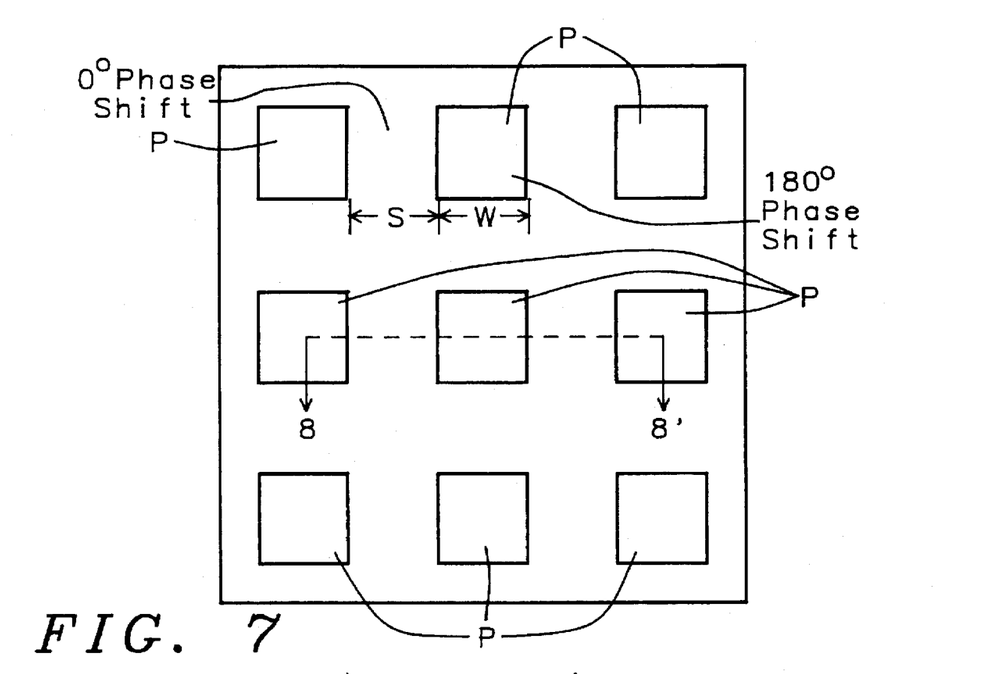
FIG. 7 shows a top view for the design of the 180 degree phase-shift mask for forming the single crown-shaped capacitor.
Figure 8:
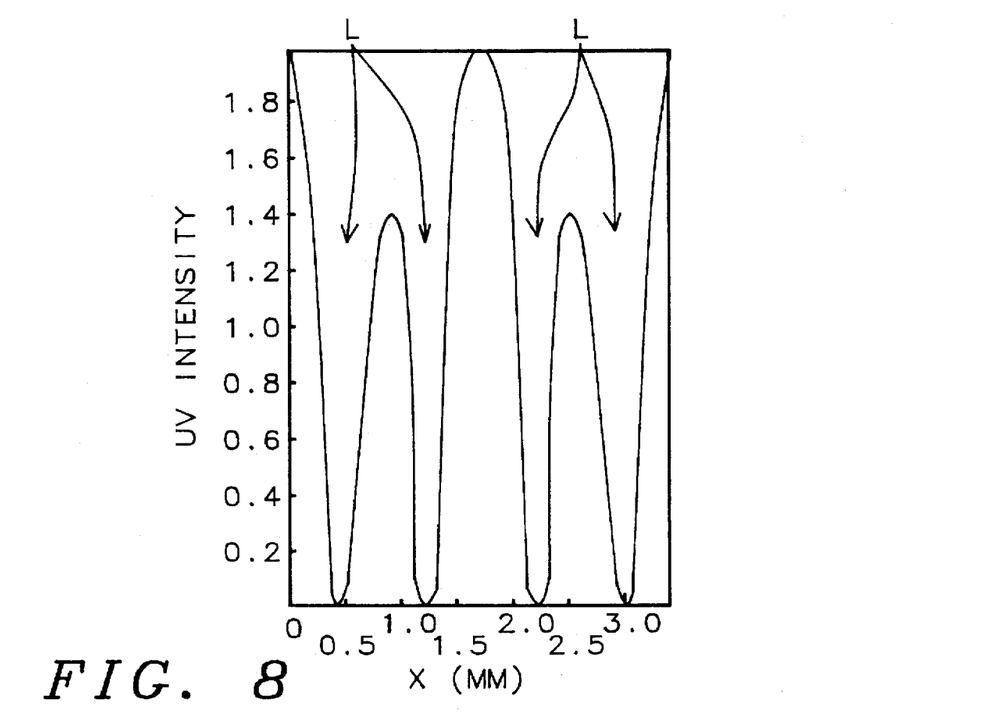
FIG. 8 shows the simulated uv light intensity distribution on the substrate surface through the region 8—8' of the 180 degrees phase-shift mask in FIG. 7 using i-line (365 nm) uv radiation.
Figure 9:
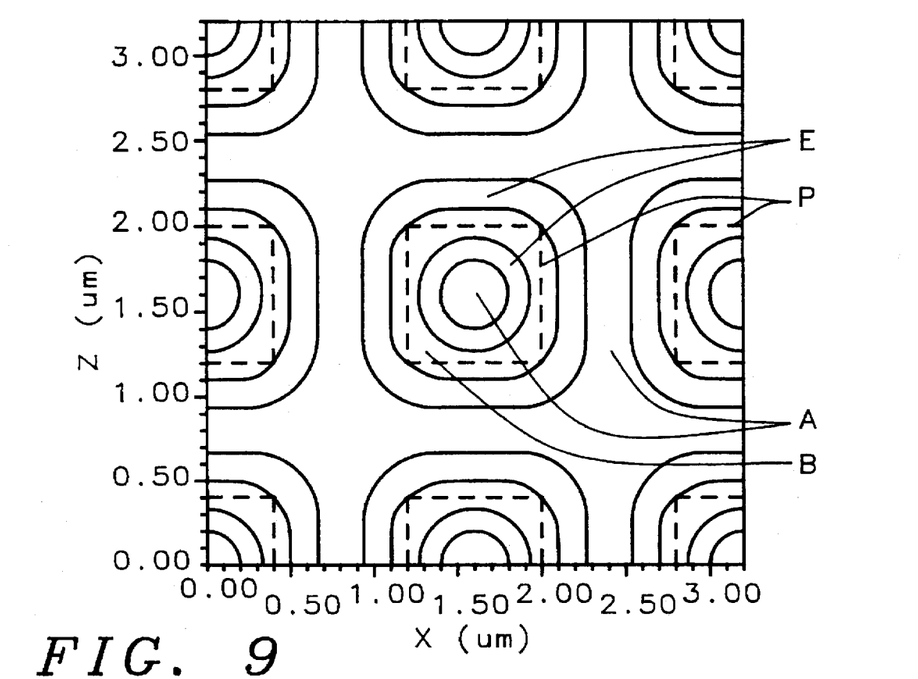
FIG. 9 shows a top view of a simulated two-dimensional contour map for the equi-intensity lines of the uv light at the substrate surface for the 180 degree edge phase-shift in FIG. 7.

Referring now more specifically to FIGS. 4 through 6, the method for forming the array of crown-shaped stacked capacitors of this invention is described in detail. Starting with FIG. 4, a conformal fifth polysilicon layer 36 is deposited on layer 32 and in the node contact openings 4. The layer 36 is preferably deposited by LPCVD using, for example, a silane ($SiH_4$) gas, and is in situ doped $N^+$ by adding an N type dopant, such as phosphine ($PH_3$), to the silane gas during LPCVD deposition. Out diffusion from layer 36 also provides the low resistance ohmic contact to the source/drain areas 17. The concentration of the phosphorus (P) in layer 36 is preferably between about 1.0 E 19 to 1.0 E 21 atoms/$cm^3$. The thickness of layer 36 is chosen to be sufficiently thick to provide an essentially planar surface for the lithography step that is formed next. The thickness of layer 36 also determines the high of the crown portion of the capacitor. The preferred thickness of layer 36 is however, between about 4000 to 6000 Angstroms. An array of crown-shaped bottom electrodes is now formed from layer 36 by the method of this invention. The method consist of depositing a positive type photoresist 38, which is then patterned by using a specially designed phase-shift mask (PSM), or a reticle and a i-line stepper to expose the photoresist. The design of the phase-shift mask for the single crown shaped capacitor electrode is shown in FIG. 7, and consist of an array of 180° phase shifting regions (material), for practical reasons only nine of the phase-shift regions labeled P are shown in FIG. 7, As is well known in physical optics the diffracted light at the perimeter of the 180° phase-shift regions destructive interference with the diffracted light from the 0° phase regions of the phase-shift mask, adjacent to the 180° phase shift regions resulting in a low light intensity under and immediately to the sides of the edge of the phase-shift regions P. A simulation of the light intensity profile for the patterned 180° phase-shift regions P through 8—8' is shown in FIG. 8. The profile is shown for regions P having widths W of 0.8 micrometers (um) and spacings S of 0.8 um, as indicated is shown in FIG. 7. The low intensity regions indicated by the arrows and labeled L in FIG. 8 result from the destructive interference of the light at the perimeter of the regions P. The horizontal axis x in FIG. 8 is measured in micrometers (um), and the vertical axis y is the intensity shown in relative intensity. A contour map (top view) of the equi-intensity lines are shown in FIG. 9. The equi-intensity contour lines, labeled E in FIG. 9 are shown between the high intensity areas, labeled A and the low intensity areas, labeled B. Also shown in FIG. 9 by the dashed line labeled P is the perimeter of the 180° phase-shift region lying within the low intensity area B. The units of measure are in micrometers for both the x and z axis.

When the mask having these 180° phase-shift regions are aligned over the capacitor cell areas and the positive photoresist is exposed using the i-line uv light, the array of crown-shaped photoresist images 38 are formed, as shown in FIG. 4 after the positive photoresist is developed. The width of these phase-shift photoresist images are considerably less (0.15 to 0.25 um) than the present day lithography resolution limits (0.35 um) when conventional masks and uv i-line exposures are used.

Referring to FIG. 4, the crown-shaped photoresist images 38 are now replicated in the underlying polysilicon layer 36 by plasma etching to form the crown-shaped bottom capacitor electrodes, Preferably, anisotropic plasma etching is used to form the bottom electrodes, for example, by reactive ion etching (RIE) in a etching gas containing chlorine and a carrier gas, such as argon. A conventional photoresist mask and anisotropic plasma etch is then used to pattern the polysilicon layer 32 removing layer 32 (in the regions indicated by 3 in FIG. 5) between and around the crown-shaped portions of the bottom electrodes, thereby electrically isolate the bottom electrodes. The resulting array of crown-shaped bottom electrodes 9 are shown in FIG. 5 after the photoresist is removed.

Referring next to FIG. 6, the array of DRAM cell are now completed. An interelectrode high dielectric insulating layer 40 is now formed on the bottom electrode 9, and a sixth polysilicon layer 42 is deposited over the dielectric layer 40 and patterned, using conventional photolithography and plasma etching, to form the top electrodes. The interelectrode dielectric layer 40 can be composed of any reliable insulator having a high dielectric constant. For example, one commonly used dielectric layer is a multi-layer composed of silicon oxide-silicon nitride-silicon oxide (ONO). The polysilicon layer 42 is preferably between about 800 to 1200 Angstroms thick, and preferably also heavily doped N-type, for example, having a concentration of between about 1.0 E 19 to 1.0 E 21 atoms/cm³. The increase in the crown-shaped capacitor area over the conventional thick stacked capacitor results in a 50 percent increase in capacitance.

The crown-shaped capacitors are now insulated and the top surface of the structure is made essentially planar for the next level of processing (e.g. electrical interconnections) by depositing and reflowing a relatively thick low temperature glass 44. For example, borophosphosilicate glass (BPSG) can be used having a preferred thickness of between about 4000 to 6000 Angstroms, and annealed at about 700° to 800° C. for 30 to 40 minutes.

Referring now to FIGS. 10 through 13A and B, a second embodiment is described for making a double crown-shaped stacked capacitor using a newly designed 180° phase-shift mask. The process steps for making the double crown-shaped capacitor DRAM cells are same as the process steps for making the memory cells for the single crown shaped capacitors, and therefore are not discussed further. Only the mask design is described which is substantially modified to provide the double crown-shaped bottom electrode.

Figure 10:
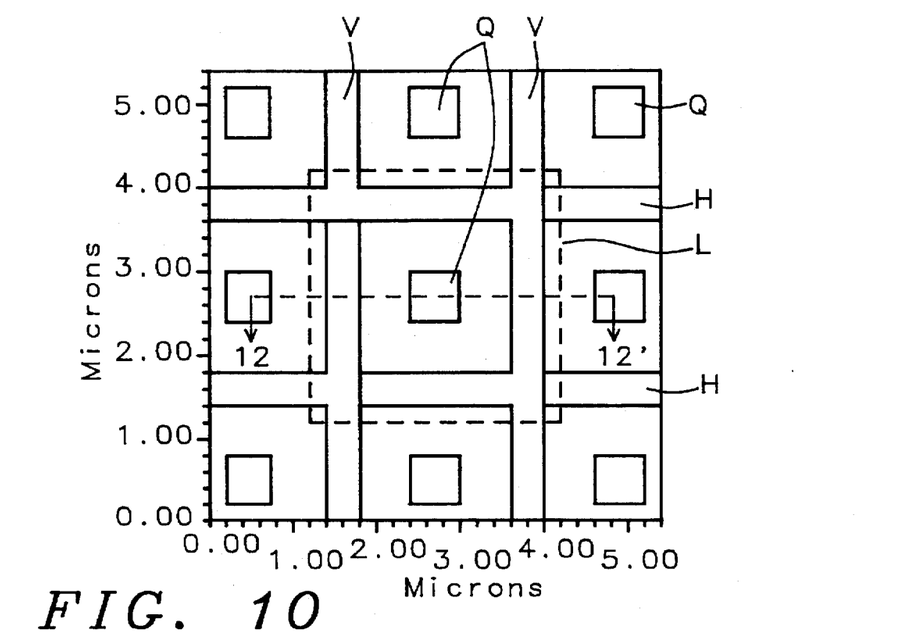
FIG. 10 shows a top view of the design of the 180 degrees edge phase-shift mask for forming the double crown-shaped capacitor.

Referring now to FIG. 10, the newly designed mask consist of forming an array of isolated 180° phase shift regions, labeled Q in FIG. 10. having in addition two arrays of 180° phase-shift stripes that are formed essentially orthogonal to each other, labeled H and V, as shown in FIG. 10. The stripes are formed between the isolate regions Q. The dimensions of the phase shift regions and the spacing between regions are selected to provide the correct image size for the patterned positive photoresist so as to fit within the DRAM cell area. By way of example only, the regions Q are square and have a width of 0.6 um and the strips H and V have a width of 0.4 um. The spacing between the stripes and the isolated Q regions is also 0.6 um.

Figure 11:
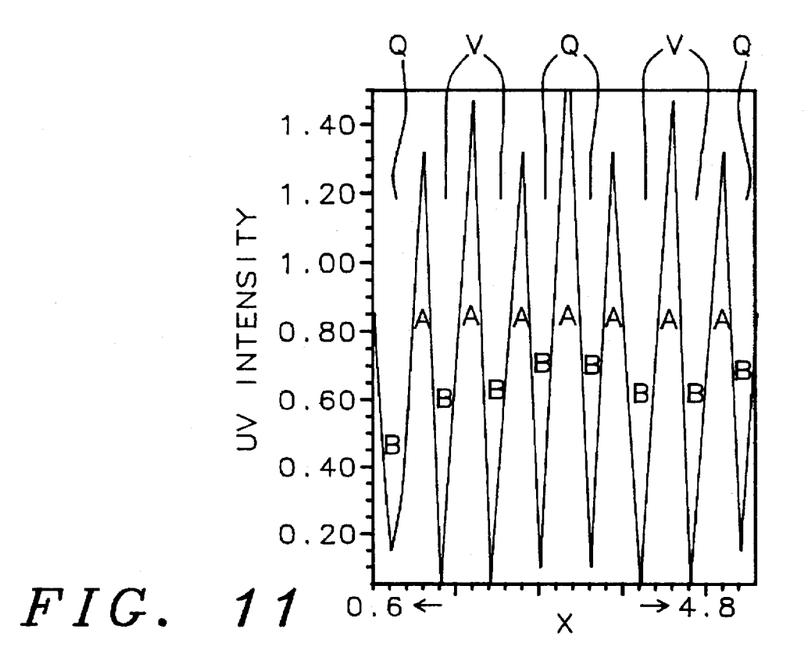
FIG. 11 shows the simulated light intensity distribution through the region 12—12' of the 180 degrees phase-shift mask (FIG. 11) for the uv light at the substrate surface for the double crown capacitor.

When this edge phase-shift mask is used to expose the positive resist using uv i-line radiation a double crown image is formed in the photoresist over each cell area. A profile of the uv light intensity at the substrate surface for this mask is shown in FIG. 11 for the cross section in FIG. 10 through the region 12—12'. As seen in FIG. 11, a minimum uv light intensity occurs at the edge the Q region, also labeled Q in FIG. 11, and a uv minimum also occurs at the edge of the stripe V, as is also indicated by the V in FIG. 11. This results in a double crown shaped image in the positive photoresist over the DRAM cell area. As is also apparent in FIG. 11, the uv light intensity is repetitive across the mask forming an array of double crown-shaped photoresist images.

Figure 12:
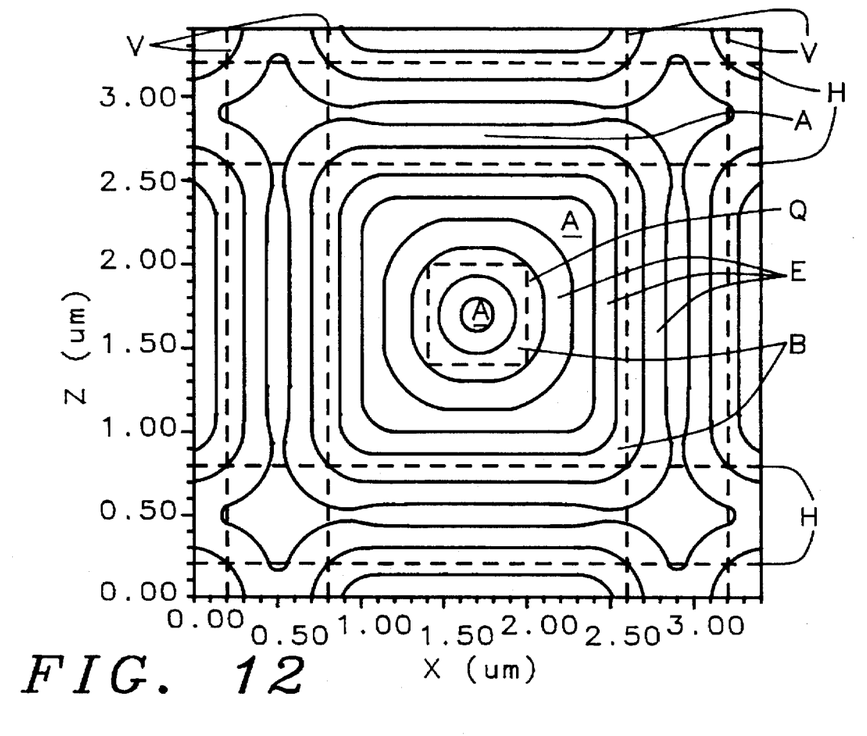
FIG. 12 shows a top view of a simulated two-dimensional contour map for the equi-intensity lines for the uv light at the substrate surface for the edge phase-shift mask for the double crown capacitor depicted in FIG. 15.

Shown in FIG. 12 is a top view of the simulation for the regions of the equi-intensity lines E between the alternating high light intensity regions A and the low light intensity regions B of the uv radiation at the substrate surface, similar to FIG. 9 for the single crown-shaped image. The light intensity pattern in FIG. 12 is for an enlarged view of a portion of the mask in FIG. 10 inclosed by the dashed line L. The dotted lines in FIG. 12 shows the positions of the 180° phase-shift regions Q, V and H on the mask relative to the uv light intensities. The low uv light intensity regions B are seen to lie over the edge of the 180° phase-shift region. It should be noted that the positive type photoresist is removed in the highly exposed regions during development, and therefore the photoresist pattern is the complement image of the light intensity profile.

Figure 13A:
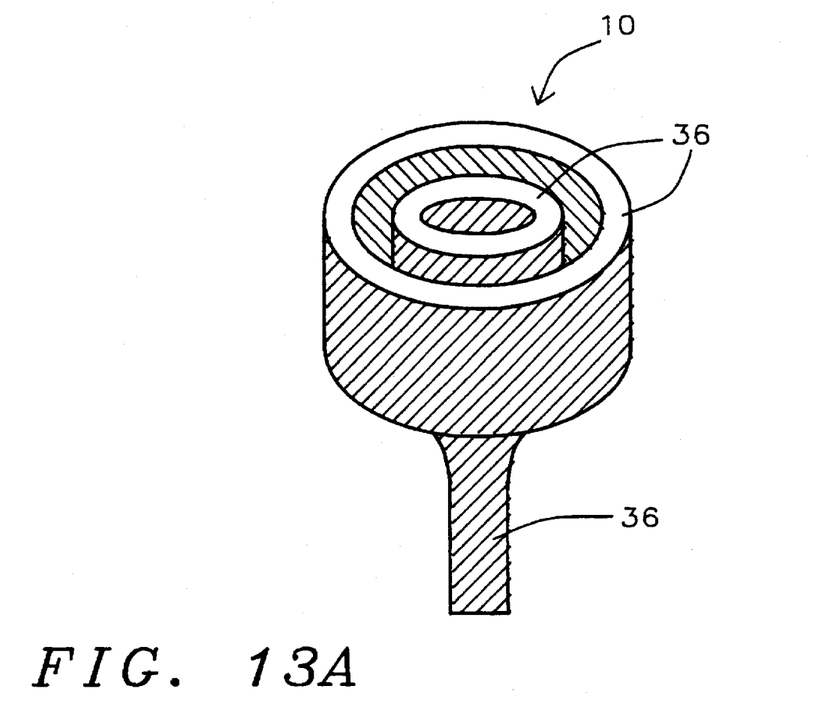
Figure 13B:
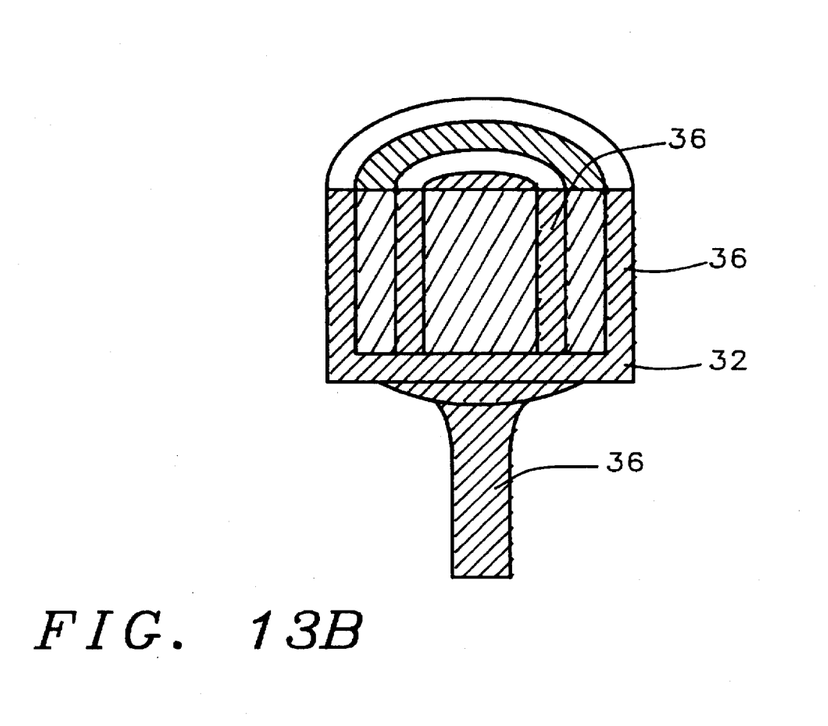

Now as shown in FIG. 13A, is an enlarged aerial view of the double crown bottom electrode 10 of the stacked capacitor that would replace the single crown bottom electrode 9, as shown in FIG. 6, if the double crown phase-shift mask, in FIG. 10, is used. The increase in capacitor area would further increase the capacitance by about 115% over a conventional thick electrode capacitor. Shown in FIG. 13-B is a cross sectional view of the double-crown capacitor bottom electrode in FIG. 13-A. The numerically labeled parts in FIGS. 13-A and 13-B are made from the same polysilicon layers used to make the single crown bottom electrode shown in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an array of crown-shaped capacitors on a semiconductor substrate in device areas, comprising the steps of:

providing a semiconductor substrate having field oxide areas surrounding and electrically isolating an array of device areas, each of said device areas having a single field effect transistor (FET) consisting of a gate electrode and having a first and second source/drain areas adjacent to and on each side of said gate electrode, and forming bit line contacts and interconnecting electrically conducting bit lines to said first source/drain areas, and further forming the crown-shape node capacitors by;

depositing a low flow temperature insulator on said field effect transistors and elsewhere on said substrate, annealing said low flow temperature insulator and forming an essentially planar surface on said low flow temperature insulator, forming contact openings in said low flow temperature insulator to said second source/drain area of each of said field effect transistors, depositing a conformal bottom electrode polysilicon layer in said node contact openings and elsewhere on said substrate, and thereby filling said contact openings and making electrical contact to said second source/drain areas, and forming an essentially planar bottom electrode polysilicon layer on said substrate;

spin coating a positive photoresist layer on said planar bottom electrode polysilicon layer;

optically exposing said positive photoresist layer using a phase-shift edge mask having an array of 180 degree phase shifting material regions aligned over the planned capacitor areas, developing said photoresist, and thereby forming a crown-shaped patterned photoresist mask on said capacitor areas; and replicating said pattern photoresist mask in said bottom electrode polysilicon layer by anisotropic etching;

removing said patterned photoresist layer, and thereby forming an array of crown-shaped bottom electrodes for said array of crown-shaped stacked capacitors;

forming an interelectrode dielectric layer on surfaces of said crown-shaped bottom electrodes, depositing a top electrode polysilicon layer on said dielectric layer and elsewhere on said substrate;

patterning said top electrode polysilicon layer and thereby forming the top electrodes of said storage capacitors and completing said array of crown-shaped stacked capacitors.

2. The method of claim 1, wherein the thickness of said bottom electrode polysilicon layer is between about 6000 to 8000 Angstroms.

3. The method of claim 1, wherein said the optical exposure is an ultra-violet i-line exposure having a wavelength of about 3650 Angstroms.

4. The method of claim 1, wherein the said phase-shift mask consist of an array of 180 degrees phase shift regions on a optical plate aligned over said planned capacitor area that are square in shape having a width of about 0.6 to 1.0 micrometers and having a spacing between said phase-shift regions 0.4 to 0.8 micrometers.

5. The method of claim 4, wherein the design of said phase-shift mask provides a single crown shaped image in said positive photoresist, and said replication in said bottom electrode polysilicon layer results in a single crown-shaped bottom electrode.

6. The method of claim 1, wherein the said phase-shift mask consist of an array of 180 degrees phase shift material on an optical plate aligned over said planned capacitor area that are square in shape having a width of between about 0.4 to 0.8 micrometers and further having two orthogonal arrays of stripes composed of said 180 degree phase-shift material running parallel to the edge and between said square shaped portions, said strips having a width of between about 0.4 to 0.8 micrometers, and spaced from said square portions by a distance of about 0.4 to 0.8 micrometers.

7. The method of claim 6, wherein the design of said phase-shift mask provides a double crown shaped image in said positive photoresist, and said replication in said bottom electrode polysilicon layer results in a double crown-shaped bottom electrode.

8. The method of claim 1, wherein said interelectrode dielectric layer is composed of a silicon oxide-silicon nitride-silicon oxide (ONO) having a thickness of between about 55 to 90 Angstroms.

9. The method of claim 1, wherein said bottom and said top electrode polysilicon layer is doped with phosphorous (P) atoms having a concentration of between about $1.0 \text{ E } 19$ to $1.0 \text{ E } 21$ atoms/cm$^3$.

10. A method for manufacturing an array of dynamic random access memory cells having crown-shaped stacked capacitors on a semiconductor substrate, comprising the steps of:

providing a semiconductor substrate having field oxide areas surrounding and electrically isolating an array of device areas, each of said device areas having a single field effect transistor (FET) consisting of a gate oxide, a gate electrode formed from a patterned first polysilicon layer and a silicide layer, and having a cap oxide thereon, each of said FETs having a first and second source/drain areas adjacent to and on each side of said gate electrode, and insulating sidewalls, said patterned first polysilicon layer and silicide layer also forming interconnecting word lines for said field effect transistors;

depositing a first insulating layer on said field effect transistors and elsewhere on said substrate;

masking and etching contact openings in said first insulating layer to said first source/drain area of each field effect transistor, and thereby forming bit line contact openings;

depositing a second polysilicon layer over said first insulating layer and in said bit line contact openings;

patterning by masking and etching said second polysilicon layer, and thereby forming interconnecting bit lines to said bit line contact openings;

depositing a second insulating layer over said bit lines and elsewhere on said substrate;

depositing a third insulating layer composed of a low flow temperature glass, and annealing said glass, and thereby forming an essentially planar surface on said third insulating layer;

depositing a third polysilicon layer on said third insulating layer;

masking and etching node contact openings in said third polysilicon layer and partially into said third insulating layer, said node contact openings aligned over said second source/drain areas of each of said field effect transistors;

depositing a conformal fourth polysilicon layer;

anisotropically etching back said fourth polysilicon layer to said third insulating layer in said node contact openings, and thereby forming sidewall spacer and reducing the width of said node contact openings;

anisotropically and selectively etching said third insulating layer in said node contact openings to the surface of said second source/drain areas, said third and fourth polysilicon layers serving as an etch mask;

depositing a conformal fifth polysilicon layer in said node contact openings and elsewhere on said third polysilicon layer, and having an essentially planar surface;

spin coating a positive photoresist layer on said fifth polysilicon layer;

optically exposing said positive photoresist layer using a phase-shift edge mask having an array of 180 degree phase shifting material regions aligned over the planned capacitor areas, and developing said photoresist, and thereby forming a crown-shaped photoresist mask on said capacitor areas; and patterning said fifth polysilicon layer by anisotropic etching;

removing said patterned photoresist layer, and thereby forming an array of crown-shaped bottom electrodes for said array of crown-shaped stacked capacitors;

forming an interelectrode dielectric layer on surfaces of said crown-shaped bottom electrodes, depositing a sixth polysilicon layer on said dielectric layer and elsewhere on said third insulating layer;

patterning said sixth polysilicon layer and forming the top electrodes of said storage capacitors and thereby completing said array of DRAM memory cells having crown-shaped stacked capacitors.

11. The method of claim 10, wherein the thickness of said bottom electrode polysilicon layer is between about 6000 to 8000 Angstroms.

12. The method of claim 10, wherein said the optical exposure is an ultra-violet i-line exposure having a wavelength of about 3650 Angstroms.

13. The method of claim 10, wherein the said phase-shift mask consist of an array of 180 degrees phase shift regions on a optical plate aligned over said planned capacitor area that are square in shape having a width of about 0.6 to 1.0 micrometers and having a spacing between said phase-shift regions 0.4 to 0.8 micrometers.

14. The method of claim 13, wherein the design of said phase-shift mask provides a single crown shaped image in said positive photoresist, and said replication in said bottom electrode polysilicon layer results in a single crown-shaped bottom electrode.

15. The method of claim 10, wherein the said phase-shift mask consist of an array of 180 degrees phase shift material on an optical plate aligned over said planned capacitor area that are square in shape having a width of about 0.4 to 0.8 micrometers and further having two orthogonal arrays of stripes composed of said 180 degree phase-shift material running parallel to the edge and between said square shaped portions, said strips having a width of between about 0.4 to 0.8 micrometers, and spaced from said square portions by a distance of about 0.4 to 0.8 micrometers.

16. The method of claim 15, wherein the design of said phase-shift mask provides a double crown shaped image in said positive photoresist, and said replication in said bottom electrode polysilicon layer results in a double crown-shaped bottom electrode.

17. The method of claim 10, wherein said interelectrode dielectric layer is composed of a silicon oxide-silicon nitride-silicon oxide (ONO) having a thickness of between about 55 to 90 Angstroms.

18. The method of claim 10, wherein said first, second third, fourth, fifth and sixth polysilicon layers are doped with N type conductive dopant having a concentration of between about 1.0 E 19 to 1.0 E 21 atoms/cm$^3$.

* * * * *